(12) United States Patent
Hara (10) Patent No.: US 8,127,438 B2
(45) Date of Patent: Mar. 6, 2012

(54) WIRING SUBSTRATE, METHOD OF MANUFACTURING WIRING SUBSTRATE, AND ELECTRONIC APPARATUS

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 675 days.

(21) Appl. No.: 11/866,657

(22) Filed: Oct. 3, 2007

(65) Prior Publication Data

US 2008/0110017 A1     May 15, 2008

(30) Foreign Application Priority Data

Nov. 15, 2006   (JP) ................................ 2006-309239

(51) Int. Cl.
*H05K 3/36* (2006.01)
*H05K 3/20* (2006.01)
*H05K 3/30* (2006.01)
*H01L 21/00* (2006.01)

(52) U.S. Cl. ................ 29/830; 29/831; 29/832; 438/30

(58) Field of Classification Search .................... 29/830, 29/825, 831, 832, 834; 257/700, 701, 704, 257/711, 731, 732, 733; 349/149; 438/30, 438/118, 455, 456, 458

See application file for complete search history.

(56) References Cited

U.S. PATENT DOCUMENTS

| | | | | | |
|---|---|---|---|---|---|
| 5,258,325 | A | * | 11/1993 | Spitzer et al. | 438/107 |
| 5,362,671 | A | * | 11/1994 | Zavracky et al. | 438/29 |
| 5,473,222 | A | * | 12/1995 | Thoeny et al. | 315/169.1 |
| 5,476,810 | A | * | 12/1995 | Curran | 438/164 |
| 5,793,115 | A | * | 8/1998 | Zavracky et al. | 257/777 |
| 6,027,958 | A | * | 2/2000 | Vu et al. | 438/110 |
| 6,114,188 | A | * | 9/2000 | Oliver et al. | 438/107 |
| 6,159,323 | A | * | 12/2000 | Joly et al. | 156/241 |
| 6,232,136 | B1 | * | 5/2001 | Zavracky et al. | 438/30 |
| 6,414,783 | B2 | * | 7/2002 | Zavracky et al. | 359/291 |
| 6,544,862 | B1 | * | 4/2003 | Bryan | 438/455 |
| 6,624,046 | B1 | * | 9/2003 | Zavracky et al. | 438/455 |
| 6,813,059 | B2 | * | 11/2004 | Hunter et al. | 359/290 |
| 6,946,361 | B2 | * | 9/2005 | Takayama et al. | 438/455 |
| 7,260,882 | B2 | * | 8/2007 | Credelle et al. | 29/600 |
| 7,482,541 | B2 | * | 1/2009 | Ito | 174/261 |

FOREIGN PATENT DOCUMENTS

| JP | 2003-297974 | * | 10/2003 |
|---|---|---|---|
| JP | A 2003-297974 | | 10/2003 |
| JP | A-2005-114917 | | 4/2005 |
| JP | A-2005-191271 | | 7/2005 |
| JP | A-2006-072372 | | 3/2006 |

\* cited by examiner

*Primary Examiner* — David Angwin
(74) *Attorney, Agent, or Firm* — Oliff & Berridge, PLC (57) ABSTRACT

A method of manufacturing a wiring substrate includes the steps of bonding a first substrate, which includes a pixel area and a drive area located around the pixel area, and is provided with a protruding section formed in the pixel area, to a second substrate on which a peripheral circuit is disposed, so that the peripheral circuit faces the drive area, and separating the second substrate from the first substrate while leaving the peripheral circuit on the first substrate. In the step of bonding the first and the second substrates, the peripheral circuit is pressure-bonded to the first substrate, and the protruding section is made abut on the second substrate in the pixel area.

9 Claims, 8 Drawing Sheets

WIRING SUBSTRATE, METHOD OF MANUFACTURING WIRING SUBSTRATE, AND ELECTRONIC APPARATUS

The entire disclosure of Japanese Patent Application No. 2006-309239, filed Nov. 15, 2006 is expressly incorporated by reference herein.

BACKGROUND OF THE INVENTION

1. Technical Field

Several aspects of the present invention relate to a wiring substrate, a method of manufacturing a wiring substrate, and an electronic apparatus, and in particular to a method of manufacturing a wiring substrate for a display and an electronic apparatus equipped with the wiring substrate.

2. Related Art

In recent years, a flexible electronic apparatus has attracted attention. For example, a flexible display provided with airy portability, shock absorbability, and flexibility of hand fitting has a potential to be an electronic apparatus playing a role in the ubiquitous computing society.

As a manufacturing method of the flexible display, a method is known in which a plurality of circuit components is previously formed on a separate substrate (a transfer source substrate) using thin film transistors (TFT) and so on, and then a flexible substrate and the transfer source substrate are disposed facing each other and are pressurized, thereby transferring a plurality of circuit components on the flexible circuit at a time (see, e.g., JP-A-2003-297974).

The circuit components are fixed, for example, face-down (with the terminals facing the substrate side) on the flexible substrate via anisotropic conductive adhesives. The anisotropic conductive adhesive has conductive particles dispersed in an adhesive (a binder), and by pressurizing the circuit element to forcedly spread the binder and thus pinching at least one conductive particle between the circuit element and an electrode of the flexible substrate, electrical connection and mechanical junction of the circuit element can be obtained. Therefore, in the case in which a plurality of circuit elements is transferred at a time, it is required to apply desired pressure evenly to every circuit element.

However, in the case in which a peripheral circuit in the periphery of a pixel area is transferred, for example, in the condition with no pixel circuit formed in the pixel area occupying a majority of the substrate, when the substrates facing each other are pressurized, there are some cases in which the both substrates have a contact with each other in the pixel area. In this case, the pressure to be applied to the connection section is released to prevent the necessary pressure from being applied to the peripheral circuit, and thus a problem arises that the electrical connection in the peripheral circuit can hardly be obtained.

Even in the case in which the peripheral circuit and the wiring on the substrate are directly connected to each other without using the anisotropic conductive adhesive or in the case in which the connection wiring is formed after the peripheral circuit is transferred on the substrate with the adhesive, it is required to apply the necessary pressure evenly thereon in order for transferring the periphery circuit.

SUMMARY

An advantage of the invention is to prevent the two substrates facing each other from having a contact with each other in the pixel area, thereby providing a manufacturing method of a wiring substrate, capable of reliably transferring the peripheral circuit on the substrate.

Another advantage of the invention is to provide a reliable wiring substrate manufactured by the manufacturing method of a wiring substrate described above, and an electronic apparatus equipped with the wiring substrate.

According to an aspect of the invention, there is provided a method of manufacturing a wiring substrate, including the steps of bonding a first substrate, which includes a pixel area and a drive area located around the pixel area, and is provided with a protruding section formed in the pixel area, and a second substrate on which a peripheral circuit is disposed, so that the peripheral circuit faces the drive area, and separating the second substrate from the first substrate while leaving the peripheral circuit on the first substrate, and in the step of bonding the first and the second substrates, the peripheral circuit is pressure-bonded to the first substrate, and the protruding section is made abut on the second substrate in the pixel area.

According to this aspect of the invention, since the protruding section abuts on the second substrate in the pixel area when the first and the second substrates are bonded with each other, it is prevented that the both substrates come into contact with each other in the pixel area. As a result, the distance between the substrates can be kept constant, thus even and necessary pressure can be applied to the peripheral circuit. Since the peripheral circuit can be pressure-bonded with substantially even pressure, the peripheral circuit can reliably be transferred on the first substrate.

It is preferable to include the step of forming a pixel circuit in the pixel area of the first substrate after the step of separating. Particularly in such a case that the pixel circuit has not yet been formed in the pixel area in the step of bonding, a large advantage can be obtained by forming the protruding section in the pixel area. It should be noted that the step of forming a pixel circuit in the pixel area of the first substrate can be provided prior to the step of bonding.

It is preferable that in the step of forming the pixel circuit, the pixel circuit is formed around the protruding section. Thus, influence of forming the protruding section to the characteristic of the pixel circuit can be eliminated.

It is preferable that the first substrate is provided with a plurality of protruding sections scattered in the pixel area. By scattering a plurality of protruding sections, the distance between the substrates in the bonding step can be kept further constant. It should be noted here that the scattered protruding sections denote that the protruding sections are disposed with arbitrary intervals, but the intervals are not necessarily even.

It is preferable that the thickness of the peripheral circuit is equal to the thickness of the protruding section. Thus, when bonding the first and second substrates, the distance between the substrates can be kept constant in a wide range, thus preventing contacts between them.

It is preferable that a separation layer is formed between the peripheral circuit and the second substrate, and the method further includes the step of supplying the separation layer with energy to weaken the adhesion force between the peripheral circuit and the second substrate after the step of bonding and prior to the step of separating. Thus, the peripheral circuit can easily be separated from the second substrate.

It is preferable that in the step of bonding, the first and second substrates are bonded with a conductive adhesive intervening between the first substrate and the peripheral circuit. Thus, the electrical connection of the peripheral circuit can be obtained simultaneously with the transfer.

It is preferable that a flexible substrate is used as the first substrate. Thus, a flexible wiring substrate can be formed.

According to another aspect of the invention, there is provided a wiring substrate manufactured by the method of manufacturing a wiring substrate described above. Since the protruding section is formed in the pixel section, the wiring substrate having the peripheral circuit reliably transferred as described above can be realized.

According to another aspect of the invention, there is provided an electronic apparatus equipped with the wiring substrate described above. Thus, the electronic apparatus with improved reliability can be realized.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

An embodiment of the invention will hereinafter be described with reference to the accompanying drawings.

Figure 1:
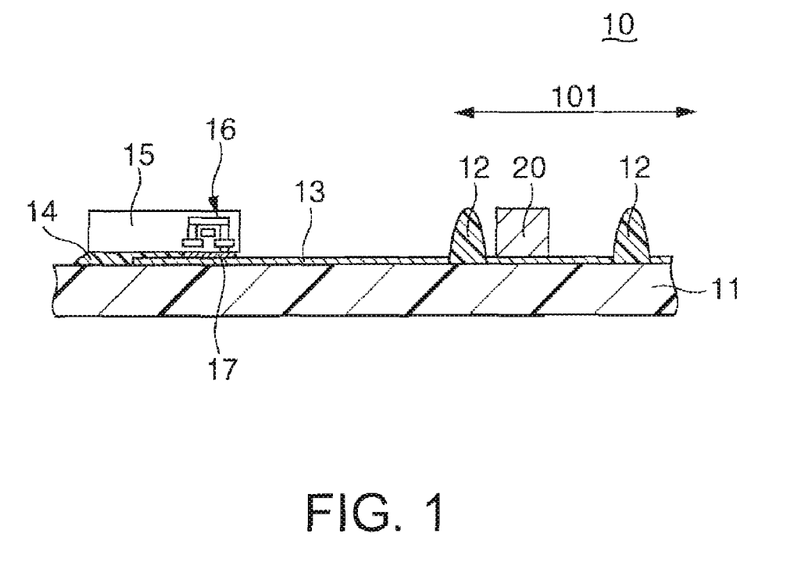
FIG. 1 is a cross-sectional view of a wiring substrate according to a first embodiment.

FIG. 1 is a cross-sectional view of a wiring substrate according to a first embodiment.

In a pixel area 101 of a flexible substrate 11, there is formed an active matrix circuit using organic thin film transistors 20. In FIG. 1, although one of the organic thin film transistors 20 is only illustrated, a plurality of organic thin film transistors 20 is formed also in an area not shown in the drawing. The active matrix circuit is one embodiment of the pixel circuit of the invention, and is not a limitation. On the pixel area 101 of the flexible substrate 11, there are formed protruding sections 12. In the present specification an area where the pixels are disposed is referred to as the pixel area 101, which includes both conditions before and after the pixels are formed in the present area.

On the flexible substrate 11 and in a drive area positioned in the periphery of the pixel area 101, there are mounted electronic elements 15 for forming a peripheral circuit. Although in FIG. 1, one of the electronic components 15 is only illustrated, a plurality of electronic elements 15 can be mounted. The electronic elements 15 are electrically connected to wiring 13 on the flexible substrate 11 via anisotropic conductive adhesives 14. Hereinafter, each of the composing elements will be explained in detail.

The flexible substrate 11 is made of a material having flexibility such as resin or metal. As the resin, cycloolefin resin, polycarbonate resin, polyimide resin, epoxy rosin, acrylic resin, polyurethane resin, acrylate resin, and so on can be cited, but there is no limitation. The thickness of the flexible substrate 11, which is not particularly limited providing the flexibility is assured, is 100 nm, for example. It should be noted that a substrate without flexibility can also be used as the substrate (the first substrate) of the embodiment of the invention.

The wiring 13 is formed on one surface of the flexible substrate. It should be noted that the wiring 13 can be formed on the other surface of the flexible substrate 11. The wiring 13 is formed of a single layer film or a multilayer film made of a conductive material such as Au, Ta, Cu, Ti, Ni, or Ag. The thickness of the wiring 13 is, for example, 100 nm or smaller. Although not shown, the wiring 13 is formed to have a shape with a large width at connections with the electronic components 15.

A plurality of organic thin film transistors 20 are formed on the pixel area 101 in a matrix, and an active matrix circuit is formed using the organic thin film transistors 20. The active matrix circuit includes, as described later, wiring such as a gate line, pixel electrodes, the organic thin film transistors 20 as switching elements.

A plurality of the protruding sections 12 is formed in the pixel area 101. The protruding sections 12 has a function of keeping the distance between the two substrates facing each other constant when mounting the electronic elements 15 as described later. Therefore, the protruding sections 12 are preferably formed to have a thickness substantially the same as that of the electronic elements 15. Further, in order for keeping the distance between the substrates constant, the protruding sections 12 are more preferably scattered in the pixel area 101 than distributed unevenly in the pixel area 101. It should be noted that the scattered protruding sections 12 denote that the protruding sections 12 are disposed with arbitrary intervals, but the intervals are not necessarily even. Further, the protruding sections 12 are preferably formed at gaps in the active matrix circuit, namely scattered at the positions not overlapping the wiring, the pixel elements, and the thin film transistors forming the active matrix circuit.

The material of the protruding section 12 is not particularly limited providing it can assure rigidity enough for avoiding crash by pressurizing the opposed substrate, and can be an organic matter such as phenol resin, cycloolefin resin, polycarbonate resin, polyimide resin, epoxy resin, acrylic resin, polyurethane resin, or acrylate resin, or an inorganic matter such as $SiO_2$ or SiN. Further, photosensitive resin can also be used as the protruding sections 12.

The electronic elements 15 are for composing the peripheral circuit, electrically connected to the wiring 13, and bonded to the flexible substrate 11. The electronic elements 15 include, for example, a thin film transistor 16, and are provided with lug-like terminals 17 formed of gold bumps formed on the surface thereof. The terminals 17 are electrically connected to the thin film transistors 16. The terminals 17 of the electronic elements 15 are connected to a part of the wiring 13. The thickness of the terminals 17 is about 2 µm, and the thickness of the electronic elements 15 is about 2 µm through 3 µm.

It should be noted that the thin film transistors 16 are exemplifications of the electronic circuits included in the electronic elements 15. The electronic element 15 does not have any particular limitations, and can be an active element such as a transistor or a diode, a passive element such as a resistor or a capacitor, or an auxiliary element such as a connector or a terminal. Further, the electronic element 15 can be a semiconductor laser or a light emitting diode. The electronic element 15 can be an element other than semiconductor elements. Further, it can be a circuit including a plurality of elements.

In order for obtaining electrical connection and mechanical connection of the electronic element 15, there is provided a conductive adhesive such as an anisotropic conductive adhesive 14 between the flexible substrate 11 and the electronic element 15.

Figure 2:
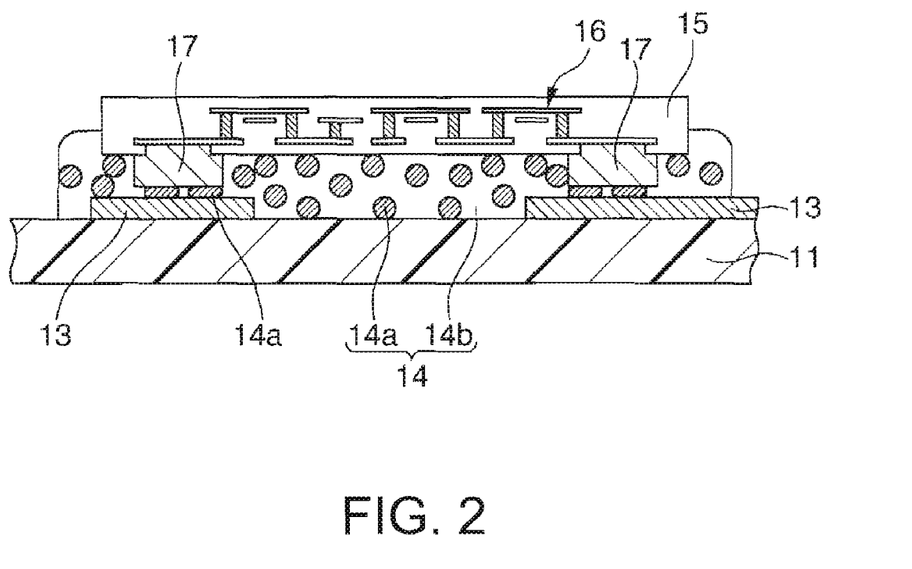
FIG. 2 is an enlarged cross-sectional view of the area between an electronic element and a flexible substrate.

FIG. 2 is an enlarged cross-sectional view of an area between the electronic element 15 and the flexible substrate 11.

The anisotropic conductive adhesive 14 is mainly composed of conductive particles 14a and an adhesive (binder) 14b, the former of which are for electrically connecting the opposed electrodes to each other, and the latter of which plays a role for mechanically fixing the connection section. It should be noted that a conductive adhesive other than those described above can be used providing that it has an adhesive function as well as a conductive property.

There are required to the conductive particles 14a not only the electrical connection, but also the shape to avoid having contact between the electrodes adjacent to each other and appropriate dispersive power. As the conductive particles 14a, there are various types such as those obtained by performing the gold plating process on metal cores (nickel (Ni) alone or Ni processed by the gold plating process) and resin cores (styrene, acrylic resin, titanium oxide, and so on), and further, those obtained by providing insulating film coating, which can be broken or melted by heat or pressure, on these particles. The substantially spherical shape is selected for the particles, and materials with particle sizes of several micrometers through several tens micrometers are used in accordance with the products the particles are to be used for. Further, as the binder 14b, synthetic rubber, thermoplastic resin, thermoset resin, and so on can be used.

Regarding the principle of connection, by applying heat and pressure for a certain period of time (a thermocompression process), the binder is spread out to hold at least one or more of the conductive particles between the opposed electrodes (between the terminal 17 and the wiring 13 in the present embodiment), thereby obtaining the electrical anisotropic property, namely, electrical conductivity in the thickness direction of the pressure bonding section and the insulation property in the surface direction thereof.

As described above, the active matrix circuit is formed in the pixel area 101 of the flexible substrate 11 using the organic thin film transistors 20, the peripheral circuit is formed on the periphery of the pixel area 101 using the electronic elements 15, thus the wiring substrate 10 is configured. It should be noted that in FIG. 1, although an example is shown in which only one electronic element 15 is mounted on the flexible substrate 11, another electronic element can also be mounted thereon.

A method of manufacturing the wiring substrate according to the present embodiment will be explained with reference to FIGS. 3 through 9.

Figure 5A:
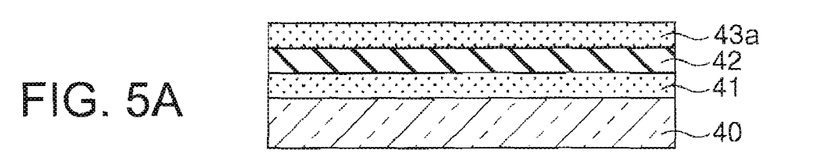
FIGS. 5A through 5D are cross-sectional views of the wiring substrate showing the process of manufacturing the wiring substrate according to the first embodiment.

Firstly, as shown in FIG. 5A, the plurality of protruding sections 12 is formed in the pixel area 101. The protruding sections 12 are preferably formed at positions where the element such as the wiring for forming the pixel circuit, the pixel electrode, or the organic thin film transistor 20 is not disposed. For example, by forming a film of photosensitive resin on the flexible substrate 11, patterning the photosensitive resin by exposure and development, and then heating it, the protruding sections 12 with hemicycle cross-sections are formed. In the case in which the material other than the photosensitive materials is used, by forming a film of the nonphotosensitive material on the flexible substrate, patterning the material by applying the resist, exposure, development, and etching, and heating the material, the protruding sections 12 with the hemicycle cross-section are formed. The thickness of the protruding sections 12 and bow to scatter the protruding sections 12 are as described above.

Figure 3A:
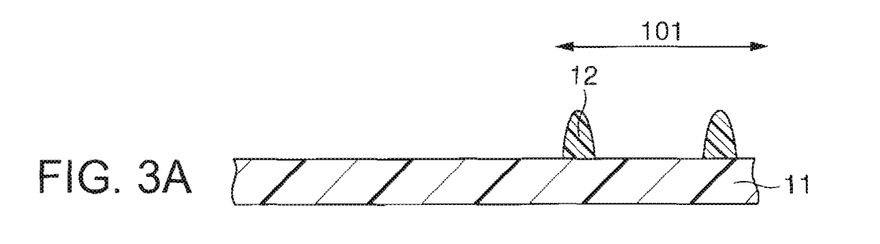
FIGS. 3A through 3D are cross-sectional views of a wiring substrate showing the process of manufacturing the wiring substrate according to the first embodiment.
Figure 3B:
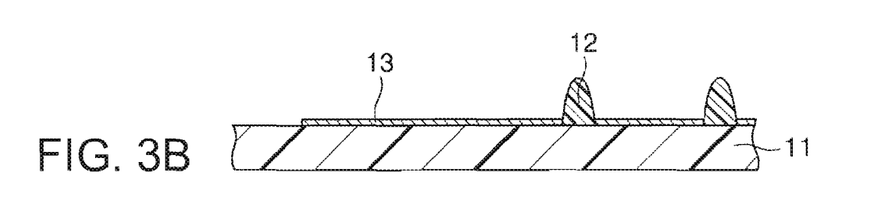

Subsequently, as shown in FIG. 3B, the wiring 13 is formed at positions not overlapping the protruding sections 12. The wiring 13 can be formed by, for example, forming a metal film on the flexible substrate 11, and then patterning the metal film. Although not shown in the drawings, the wiring 13 is patterned to have a wide pad shape in the connection section between the electronic element 15 and the terminal 17. In the present forming process of the wiring 13, it is possible to simultaneously form the wiring of the pixel area 101 or the pixel electrodes. The material of the metal film is as described above. Alternatively, the wiring 13 can also be formed by, for example, applying a liquid containing a conductive material, performing a process such as heating on the applied film, and then patterning the applied film. Further, the wiring 13 can also be formed using a printing method. In the printing method, since the desired pattern can be drawn using the droplets of the solution including the conductive material, the patterning can be eliminated.

Figure 3C:
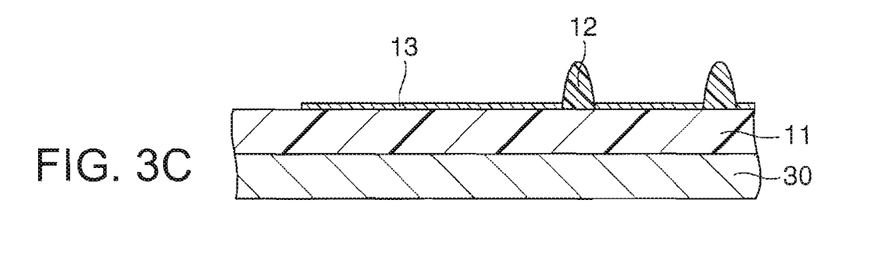

Subsequently, as shown in FIG. 3C, the flexible substrate 11 is bonded with a support substrate 30 with higher rigidity than the flexible substrate 11. The reason why the flexible substrate 11 is bonded with the support substrate 30 is for making the alignment of the electronic elements (members) 15 in the mounting process easy, and for dispersing the load applied in the pressurizing process. As the support substrate 30, a material suitable for performing the work described above, such as a glass substrate, is used.

Figure 3D:
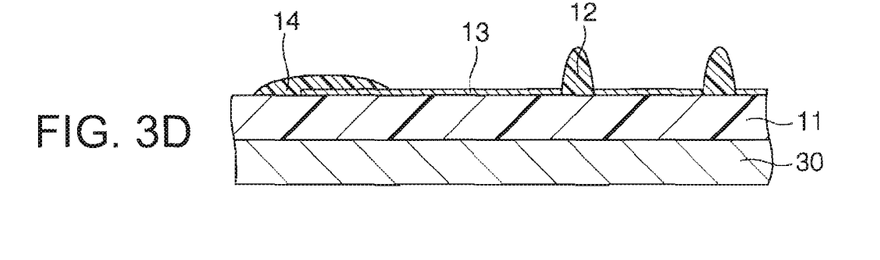

Subsequently, as shown in FIG. 3D, the anisotropic conductive adhesive 14 is applied to the areas in the flexible substrate 11, to which the electronic elements 15 are disposed. For example, the anisotropic conductive adhesive 14 is applied using the screen printing. The thickness of the anisotropic conductive adhesive 14 is, for example, 2 μm through 5 μm. It should be noted that the anisotropic conductive adhesive 14 can be applied using, for example, a dispensing technology besides the screen printing. Further, as the anisotropic conductive adhesive 14, both the paste type and the film type can be used.

Figure 4A:
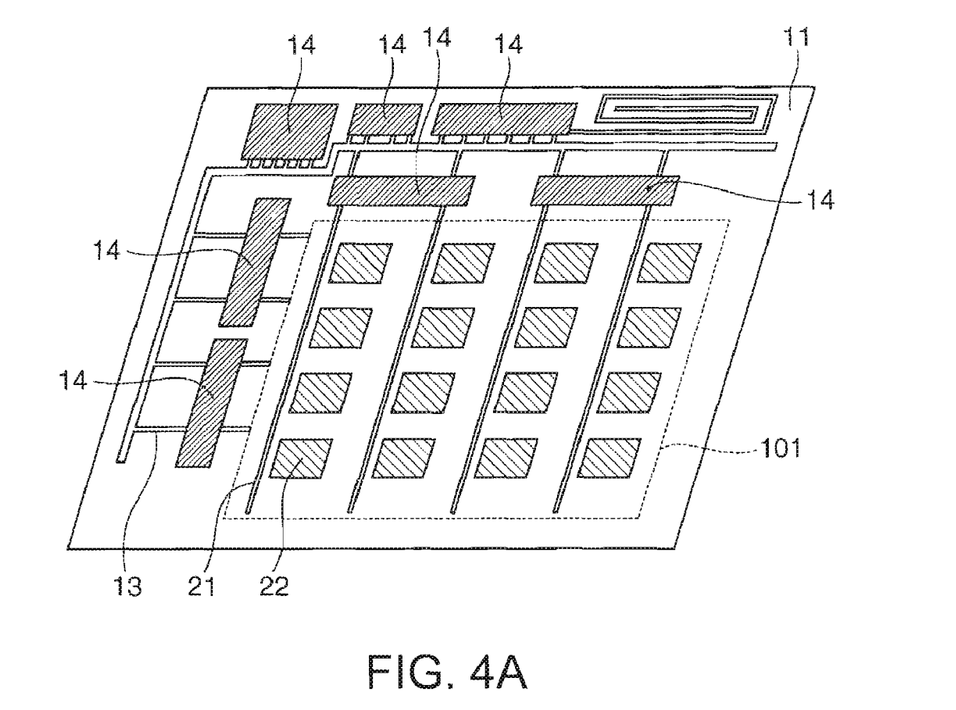
FIGS. 4A and 4B are views of the wiring substrate showing the process of manufacturing the wiring substrate according to the first embodiment.

FIG. 4A is a plan view of the flexible substrate 11 processed through the steps shown in FIGS. 3A through 3D.

In the periphery of the pixel area 101, there is formed the wiring 13. In the pixel area 101, a plurality of pixel electrodes 22 is formed in a matrix, and a plurality of data lines 21 extending column-wise. The data lines 21 and the pixel electrodes 22 are formed simultaneously with the wiring 13. It should be noted that the data lines 21 and the pixel electrodes 22 are not required to be formed at this moment. In this case, the data lines 21 and the pixel electrodes 22 are formed in the step of forming the organic thin film transistors 20 described later. For example, the anisotropic conductive adhesive 14 is disposed as illustrated with hatched areas shown in FIG. 4A.

Figure 4B:
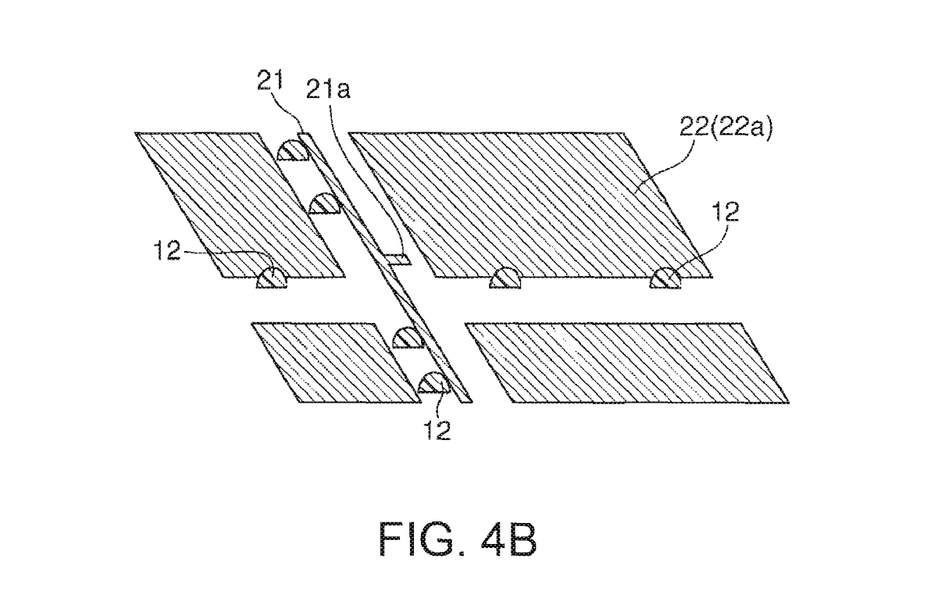

FIG. 4B is a plan view of the substantial part of the pixel area 101.

As shown in FIG. 4B, the source electrode 21a of the organic thin film transistor is formed integrally with the data line 21 in the region of each of the pixel electrodes 22. The pixel electrode 22 becomes a drain electrode of the organic thin film transistor 20. In the gap between the pixel electrodes 22 and the data lines 21, in more detail, at positions not overlapping the organic thin film transistors 20 nor the gate lines 25 to be formed later, a plurality of protruding sections 12 are scattered. Although in the present embodiment, an example of forming granulated protruding sections 12 will be explained, the protruding sections can have a linear shape, or a cross shape, and do not have a limitation in the planar shape.

On the other hand, the electronic elements provided with, for example, the thin film transistors are formed on a separate substrate. Hereinafter, an example of a manufacturing process of a polysilicon TFT as the thin film transistor (TFT), will be explained.

As shown in FIG. 5A, a separation layer 41 made of amorphous silicon can be formed on the substrate 40 made of quartz or glass by a plasma CVD using $SiH_4$ or an LPCVD process using $Si_2H_6$. Subsequently, after forming a foundation layer 42 made of silicon oxide on the separation layer 41, an amorphous silicon layer 43a is formed on the foundation layer 42.

Figure 5B:
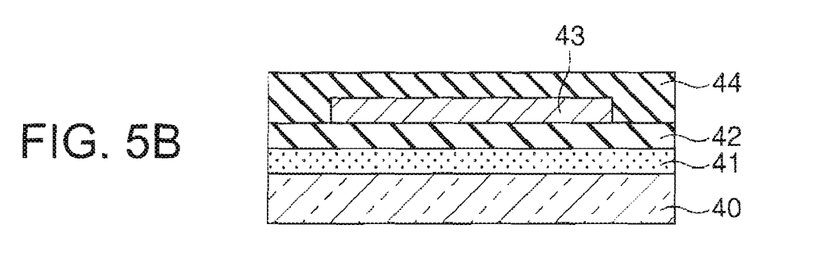

Subsequently, as shown in FIG. 5B, a polysilicon layer 43 is formed by irradiating the amorphous silicon layer 43a with a laser beam to crystallize the amorphous silicon. Subsequently, after patterning the polysilicon layer 43, a gate insulation film 44 made, for example, of silicon oxide is formed on the poly silicon layer 43.

Figure 5C:
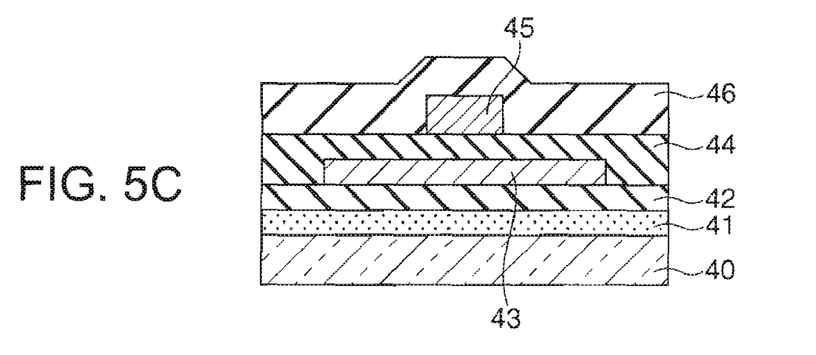

Subsequently, as shown in FIG. 5C, a metal film is formed on the gate insulation film 44, and then the metal film is patterned to form the gate electrode 45. Further subsequently, an interlayer insulation film 46 made of silicon oxide, for example, is formed on the gate insulation film 44 and the gate electrode 45.

Figure 5D:
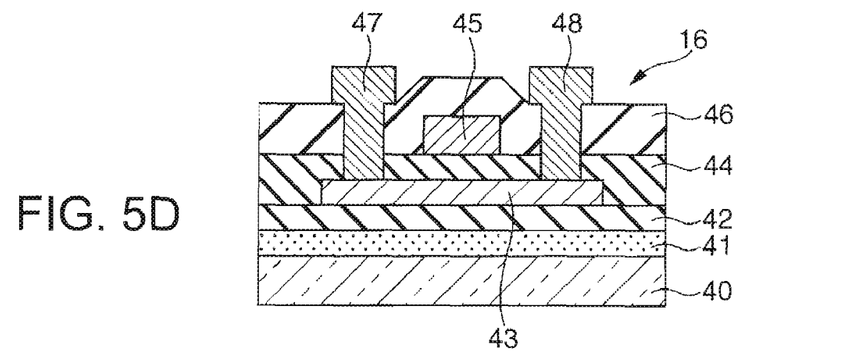

Then, as shown in FIG. 5D, two contact holes reaching the polysilicon layer 43 are formed through the interlayer insulation film 46 and the gate insulation film 44. Subsequently, a metal film for filling in the contact holes is formed on the interlayer insulation film 46, and then patterned to form the source electrode 47 and the drain electrode 48.

Through the above steps, the thin film transistor 16 made of polysilicon TFT is formed on the substrate 40 via the separation layer 41.

Figure 6A:
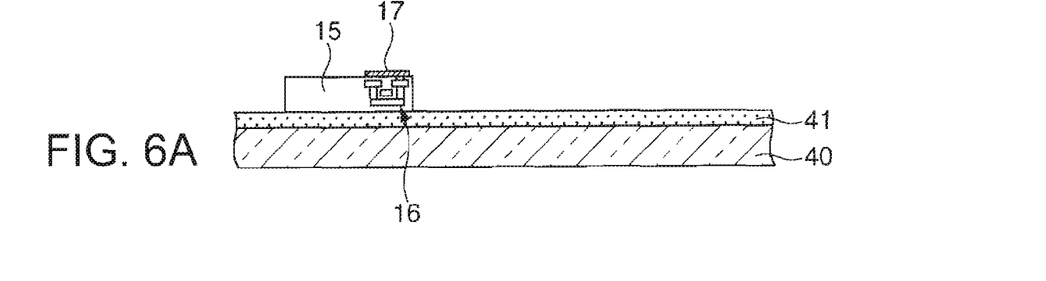
FIGS. 6A and 6B are cross-sectional views of the wiring substrate showing the process of manufacturing the wiring substrate according to the first embodiment.

As shown in FIG. 6A, according to the process for forming the thin film transistor 16 described above, the electronic element 15 is formed on the substrate 40 via the separation layer 41. The electronic element 15 is generally provided with a plurality of the thin film transistors 16, and a circuit for realizing a desired function is formed with the plurality of thin film transistors 16. In an area not shown in the drawings, there are formed a plurality of electronic elements 15 on the substrate 40. On the upper surface of the electronic element 15, there is formed a lag like terminal 17 for connecting to the thin film transistor 16. In the present embodiment, a CPU, a memory, and a driver for forming a peripheral circuit for the flexible display are respectively manufactured as the electronic elements 15.

Figure 6B:
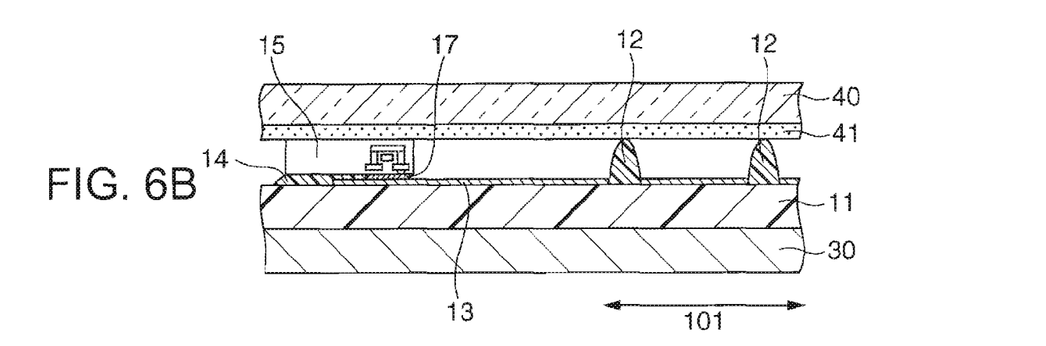

As shown in FIG. 6B, the flexible substrate 11 provided with the protruding sections 12 formed in the pixel area 101 and the substrate 40 provided with the electronic elements 15 disposed corresponding to the periphery of the pixel area 101 are bonded under predetermined pressure, and then the energy (e.g., heat is supplied to the anisotropic conductive adhesive 14 to cure it. Thus, the electrical connection between the terminal 17 of the electronic elements 15 and the wiring 13 and the mechanical bonding between the electronic elements 15 and the flexible substrate 11 can be achieved. In the present embodiment, a plurality of elements forming the peripheral circuit is simultaneously transferred thereto as the electronic element 15. It should be noted that the plurality of elements forming the periphery circuit can be transferred separately in a plurality of times.

In the present step, while the electronic element 15 is pressed against the flexible substrate 11 via the anisotropic conductive adhesive 14 in the peripheral area, the protruding sections 12 have contacts with the substrate 40 in the pixel area. Therefore, it can be prevented that the both substrates come into contact with each other in the pixel area 101 occupying a majority of the flexible substrate 11. As a result, the distance between the both substrates 11, 40 can be kept constant allowing even and necessary pressure to be applied to all of the electronic elements 15, thus the electrical connection via the anisotropic conductive adhesive 14 can be obtained in all of the electronic elements 15. In order for achieving the advantage, a plurality of protruding sections 12 is preferably scattered in the pixel area 101.

Figure 7A:
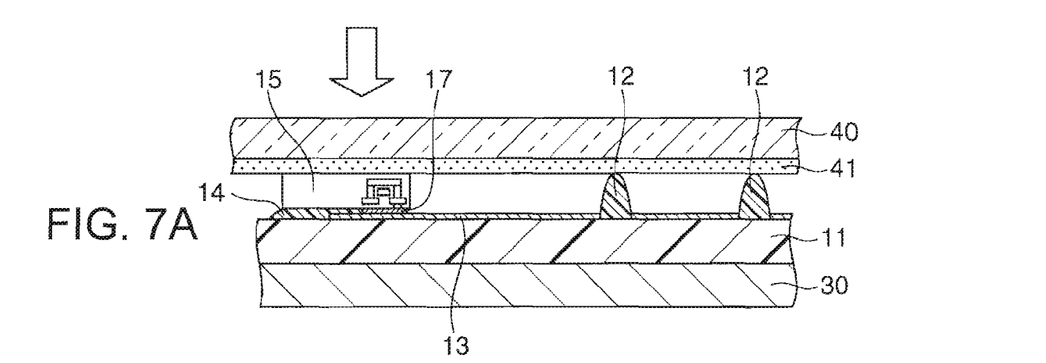
FIGS. 7A and 7B are cross-sectional views of the wiring substrate showing the process of manufacturing the wiring substrate according to the first embodiment.

Subsequently, as shown in FIG. 7A, the separation layers 41 between the electronic elements 15 to be mounted and the substrate 40 are supplied with energy. For example, when the separation layer 41 made of amorphous silicon is irradiated with excimer laser beam, Si—H bond in the separation layer 41 is broken to generate hydrogen, thus the density of the separation layer 41 is lowered. Therefore, it becomes the condition in which the electronic elements 15 can be separated with weak force. It should be noted that other laser beams than the excimer laser beam can be used providing that the necessary energy for separating the separation layers 41 can be supplied.

Figure 7B:
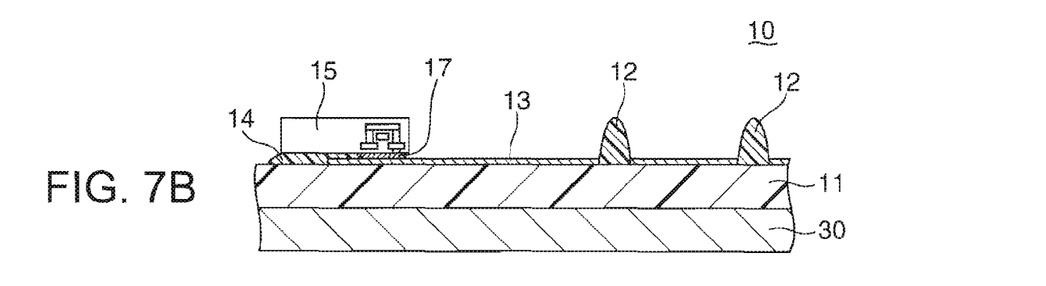

Subsequently, as shown in FIG. 7B, by separating the substrate 40 from the flexible substrate 11, the electronic elements 15 can be separated from the substrate 40 in the boundary of the separation layers 41, thus the electronic elements 15 can be transferred on the flexible substrate 11.

In the present embodiment, in order for manufacturing a wiring substrate 10 for the flexible display, the organic thin film transistors as the switching elements are formed in the pixel area 101 of the flexible substrate 11, thereby forming the active matrix circuit (a pixel circuit). Hereinafter, an example of a manufacturing process of the organic thin film transistor will be explained. It should be noted that the data lines 21 and the pixel electrodes 22 can be formed after transferring the electronic elements 15.

Figure 8A:
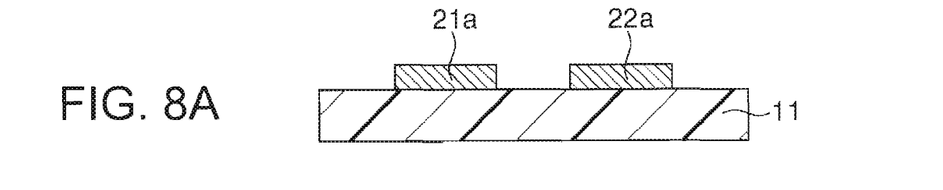
FIGS. 8A through 8D are cross-sectional views of the wiring substrate showing the process of manufacturing the wiring substrate according to the first embodiment.

As shown in FIG. 5A, the source electrode 21a and the drain electrode 22a are formed in the pixel area 101 on the flexible substrate 11. These electrodes are formed simultaneously with the wiring 13. It should be noted that in the area not shown in the drawings, the data lines 21 and the pixel electrodes 22 are formed similarly (see FIG. 4). Further, in the case in which no element is formed at all in the pixel area 101, the source electrodes 21a and the data lines 21 are preferably formed in the present step.

Figure 8B:
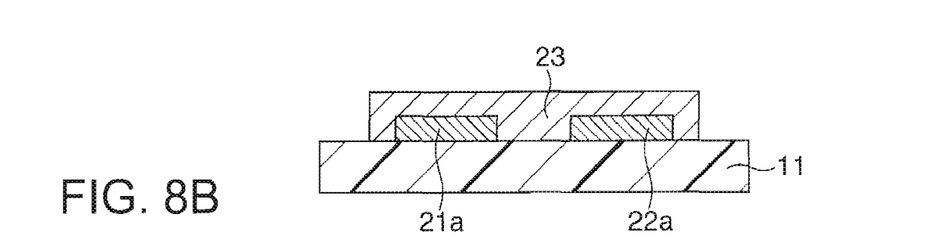

Subsequently, as shown in FIG. 8B, an organic semiconductor layer 23 is formed on the source electrodes 21a, the drain electrodes 22a, and the flexible substrate 11 exposed between the source electrodes 21a and the drain electrodes 22a. The organic semiconductor layer 23 can be formed by, for example, applying (supplying) the solution containing the organic semiconductor material or precursor thereof, then performing a process such as heating on the applied film according to needs, and then patterning the applied film. Further, the organic semiconductor layer 23 can also be formed using a printing method. As the organic semiconductor material, a small molecular organic semiconductor material such as pentacene, hexacene, or phthalocyanine or a polymeric organic semiconductor material (a conjugated polymeric material) such as polythiophene or poly(p-phenylenevinylene) can also be used.

Figure 8C:
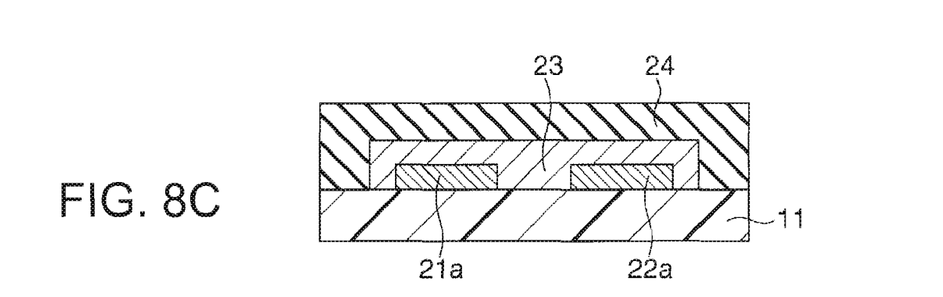

Subsequently, as shown in FIG. 8C, a gate insulation layer 24 is formed so as to cover at least the organic semiconductor layer 23. The gate insulation layer 24 can be formed by applying (supplying) the solution containing the insulating material or precursor thereof, then performing a process such as heating on the applied film according to needs. Further, the gate insulating layer 24 can also be formed using a printing method. As the gate insulating layer 24, an inorganic insulating material such as $SiO_2$, or an organic insulating material such as polystyrene, polyimide, polycarbonate (PC), or polymethylmethacrylate (PMMA) can also be used.

Figure 8D:
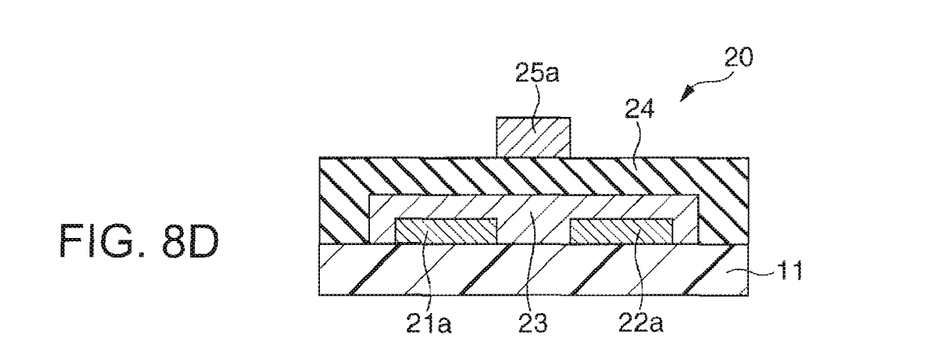

Subsequently, as shown in FIG. 5D, the gate electrode 25a is formed on the gate insulating layer 94. The gate electrode 25a can also be formed by, for example, applying a liquid containing a conductive material, performing a process such as heating on the applied film, and then patterning the applied film. Further, the gate electrode 25a can also be formed using a printing method. As the conductive material, a metal material such as Pd, Pt, Au, W, Ta, Mo, Al, Cr, Ti, Cu, Ag, or an alloy including one of these metals, or a metal oxide material such as indium tin oxide (ITO) can also be used.

According to the steps described above, the organic thin film transistors 20 can be formed on the flexible substrate 11. According to the process of forming the organic thin film transistor 20, the active matrix circuit 18 can be formed.

Figure 9A:
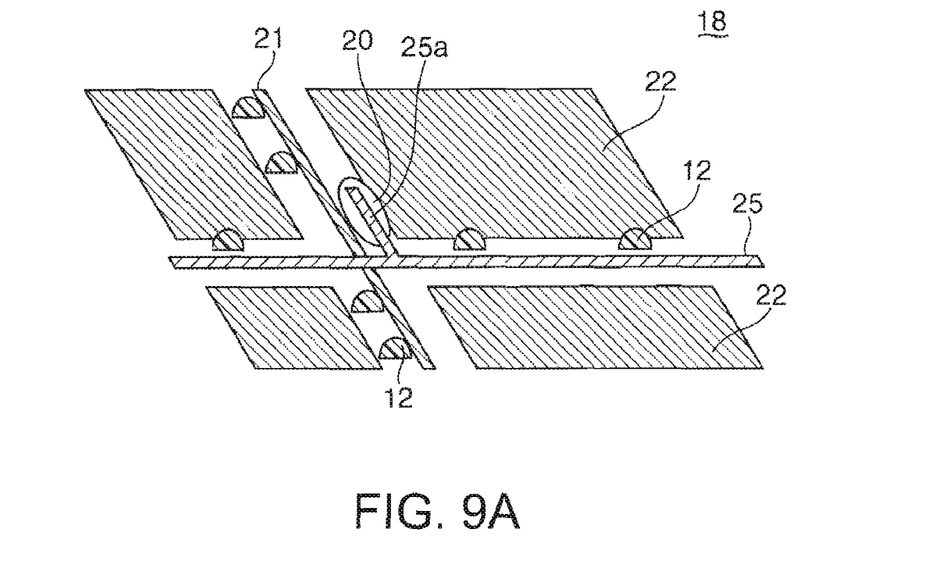
FIGS. 9A and 9B are views of the wiring substrate showing the process of manufacturing the wiring substrate according to the first embodiment.

FIG. 9A is a plan view showing a substantial part of the active matrix circuit 18. As shown in FIG. 9A, the organic thin film transistor 20 is formed between the data line 21 and the pixel electrode 22, and the gate line 25 connected to the gate electrode 25a of the organic thin film transistor 20 is formed in a direction traversing the data line 21. The gate line 25 is formed simultaneously with the gate electrode 25a.

According to the steps described above, the wiring substrate for the display can be manufactured. In the case in which the wiring substrate for an electrophoretic display device is formed, only the following steps are further required.

Figure 9B:
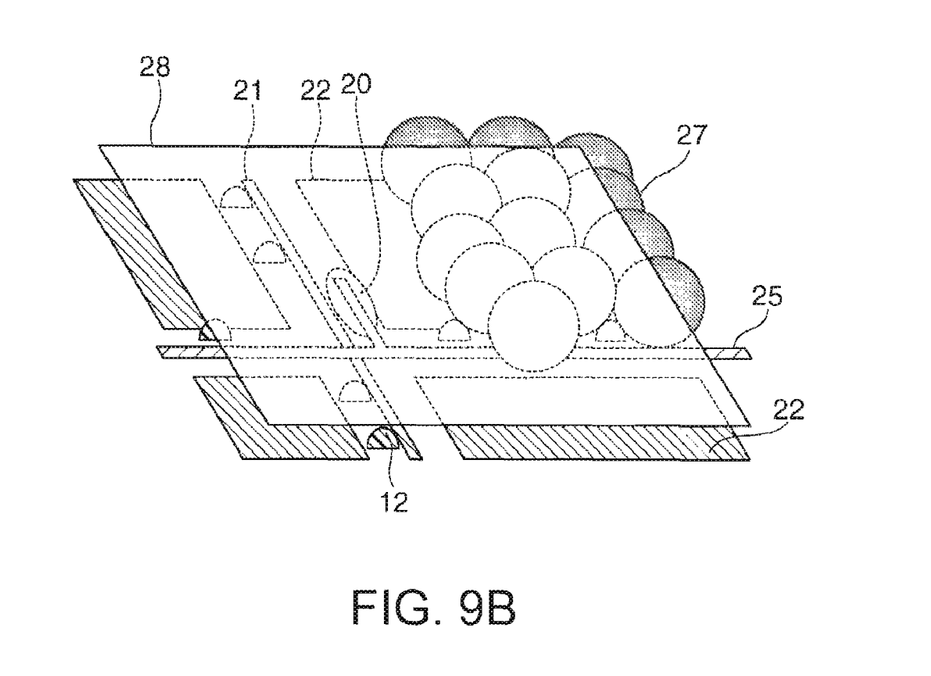

As shown in FIG. 9B, a film dispersing the microcapsule 27 is formed as an upper layer of the active matrix circuit 18. In each of the microcapsules 27, electrophoretic dispersion liquid including plural kinds of electrophoretic particles having different characteristics from each other, for example, two kinds of electrophoretic particles having different charges and colors is encapsulated. Subsequently, an opposed electrode 28 is formed on the film including the microcapsules. For example, a sheet made of a transparent electrode material such as ITO) is laminated. It should be noted that an opposed substrate including the opposed electrode 28 can be bonded on the wiring substrate. In this case a flexible opposed substrate will be used.

According to the steps described above, the wiring substrate for the electrophoretic display device can be manufactured. It should be noted that the wiring substrate according to the embodiment of the invention can also be used for an organic EL device, a liquid crystal device, and so on, without any limitations in the display method.

In the electrophoretic display device, when the gate line 95 is supplied with the selection signal (the selection voltage), the organic thin film transistor 20 connected to the gate line 25 supplied with the selection signal is turned to be an on state. Thus, the data lines 21 and the pixel electrode 22 connected to the present organic thin film transistor 20 are substantially electrically connected. In this case, if the desired data (voltage) is supplied to the data line 21, the data (voltage) is then supplied to the pixel electrode 22. Then, an electric field is generated between the pixel electrode 22 and the opposed electrode 28, and the electrophoretic particles 27 are electrophoresed toward either of the electrodes 22, 28 in accordance with the direction and strength of the electric field, and so on.

Meanwhile, in this state, when the supply of the selection signal to the gate lines 25 is stopped, the thin film transistor 20 is switched off bringing the data line 21 and the pixel electrode 22 connected to the thin film transistor 20 into an electrically disconnected state. Therefore, by executing supplying or stopping the selection signals to the gate lines 25 and supplying or stopping the data to the data lines 92 in combination, desired images can be displayed on the display pixels of the electrophoretic display device.

Figure 10:
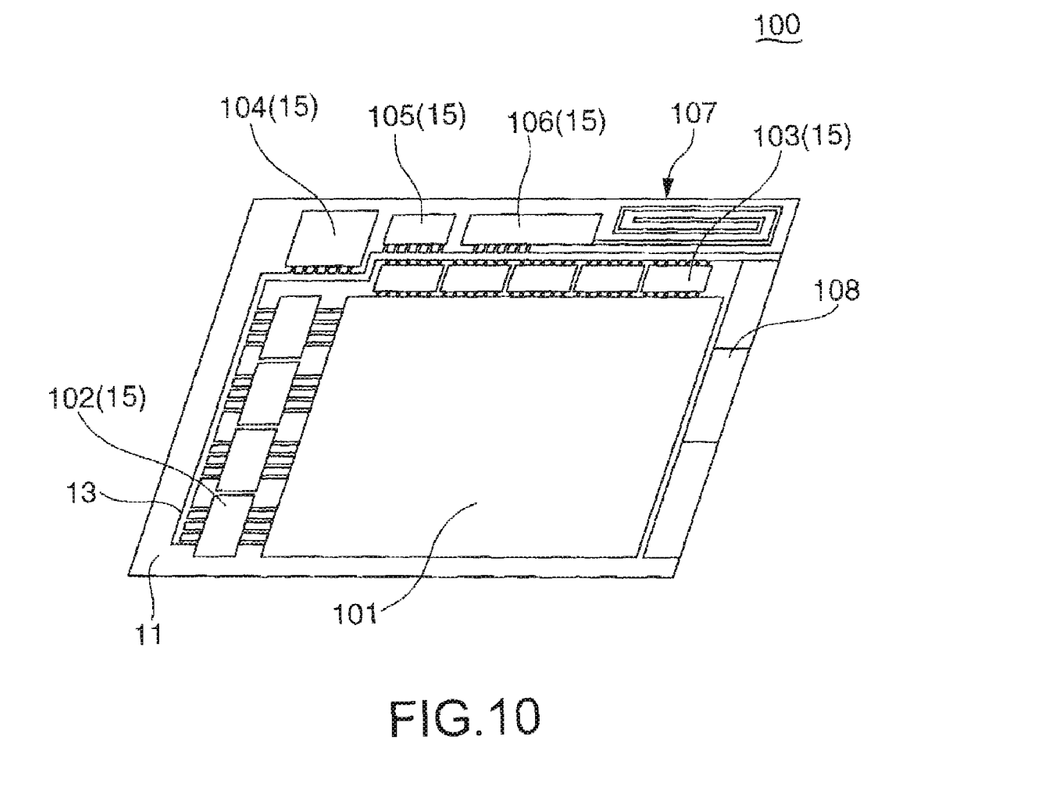
FIG. 10 is a view showing a schematic configuration of a flexible display as an example of an electronic apparatus.

FIG. 10 is a view showing a schematic configuration of a flexible display as an example of an electronic apparatus according to the invention. Although in FIG. 10, the example of the flexible display of a type to which image information is delivered in a noncontact manner is shown, the invention is not limited thereto.

The flexible display 100 includes the pixel area 101 formed on the flexible substrate 11, a vertical driver 102, a horizontal driver 103, a CPU 104, a RAM 105, an RF circuit 106, and an antenna 107. Each of the sections 101 through 107 is connected to the wiring 13 formed on the flexible substrate 11.

The pixel area 101 is composed of the active matrix circuit 18, microcapsules 27, and the opposed electrode 28 shown in FIGS. 9A and 9B.

The vertical driver 102 is electrically connected to the gate lines 25 of the pixel area 101, and outputs the selection signal for selecting the pixel of the pixel area 101 based on the signal from the CPU 104. The vertical driver 102 is provided with a shift register with the number of outputs no smaller than the number of the gate lines 25.

The horizontal driver 103 is electrically connected to the data lines 21 of the pixel area 101, and outputs the data signal corresponding to the data to be displayed by the pixel in the pixel area 101. The horizontal driver 103 is provided with a shift register with the number of outputs no smaller than the number of the data lines 21.

The CPU 104 is a central processing unit, and executes a desired software program to control the display operation of the overall device. The RAM 105 is used as a temporary work area of the CPU 104.

The RF circuit 106 includes a transmission circuit for outputting a signal to the antenna 107, and a reception circuit for receiving the signal from the antenna 107. The antenna 107 is provided on the periphery of the flexible substrate to have a loop shape.

A solar battery 108 converts optical energy into the electricity necessary for the display operation. The electricity is supplied to the CPU 104 and so on. The solar battery 108 has, for example, a pn-junction structure or a dye sensitizing structure. In the case of the pn-junction structure, the solar battery is formed using a silicon material such as polysilicon. In the case of the dye sensitizing structure, the solar battery is formed directly on the flexible substrate using an organic material.

In the flexible display shown in FIG. 10, when a radio wave is received by the antenna 107, the image information carried by the radio wave is retrieved by the RF circuit, the image information is separated into the selection signal and the data signal by the CPU 104, and then the separated signals are separately output to the vertical driver 102 and the horizontal driver 103, respectively.

In the flexible display according to the present embodiment described above, by mounting the electronic elements 15 shown in FIG. 1, the peripheral circuit for the pixel area 101 such as the vertical driver 102, the horizontal driver 1035 the CPU 104, the RAM 105, and the RF circuit 106 can be formed. Further, the pixel area 101 is formed directly on the flexible substrate 11. The solar battery 108 can be formed directly on the flexible substrate 11 or transferred on the flexible substrate 11 similarly to the other peripheral circuits.

As explained above, according to the manufacturing method of the wiring substrate of the present embodiment, since the protruding sections 31 abuts on the substrate 40 in the pixel area 101 when the flexible substrate 11 and the substrate 40 are bonded with each other, it can be prevented that the substrates come into contact with each other in the pixel area 101. As a result, the distance between the both substrates 11, 40 can be kept constant, thus the even and necessary pressure can be applied to all of the electronic elements 15. Therefore, the electrical connection and the mechanical bonding via the anisotropic conductive adhesive 14 can be obtained in every electronic element 15. By forming the protruding sections 12 at the position not overlapping the active matrix circuit in the pixel area 101, influence to the characteristics of the active matrix circuit can also be eliminated. Therefore, the reliability of the wiring substrate can be improved.

Further, by providing the wiring substrate described above, the display with improved reliability can be realized. By forming the peripheral circuit using the electronic elements 15 including the polysilicon TFT, the display with improved drive capacity can be realized in comparison with the case of using the organic TFT.

Further, by forming the active matrix circuit 18 provided with the organic TFT as the switching elements in the pixel area 101 of the flexible substrate 11, the active matrix circuit 18 can be formed by the coating method or the printing method, thus the consumption of material and energy can be controlled. Therefore, it can be manufactured with little burdens on the environment at a low price. Further, since the pixel area 101 does not influence the drive capacity of the whole display, the advantages on the manufacturing process can be obtained without degrading the drive capacity of the display.

It should be noted that the electronic apparatus according to an embodiment of the invention is only required to be provided with the wiring substrate with flexibility, and can be applied to display devices other than the electronic paper such as a liquid crystal display device or an organic EL display device.

The invention is not limited to the explanation of the embodiments described above.

It should be noted that it is possible that a part or the whole of the active matrix circuit (the pixel circuit) has previously been formed prior to the step of bonding the flexible substrate 11 and the substrate 40 with each other, namely, prior to the step of transferring the electronic element 15.

In addition to the above descriptions, various modifications are possible within the scope and the spirit of the present invention.

What is claimed is:

1. A method of manufacturing a wiring substrate, comprising:
    bonding a first substrate to a second substrate, the first substrate including a drive area and a plurality of pixel electrodes forming a pixel area, the drive area being located outside the pixel area, the first substrate being provided with at least one protruding section formed within the pixel area, a peripheral circuit being disposed on the second substrate such that the peripheral circuit faces the drive area of the first substrate, the at least one protruding section being located outside the peripheral circuit in plan view; and
    separating the second substrate from the at least one protruding section of the first substrate while leaving the peripheral circuit on the first substrate,
    the at least one protruding section abutting the second substrate when bonding the first substrate to the second substrate, and
    the peripheral circuit being pressure-bonded to the first substrate.

2. The method of manufacturing a wiring substrate according to claim 1, further comprising:
    forming a pixel circuit in the pixel area of the first substrate after the step of separating.

3. The method of manufacturing a wiring substrate according to claim 1, further comprising:
    forming a pixel circuit in the pixel area of the first substrate prior to the step of bonding.

4. The method of manufacturing a wiring substrate according to claim 2,
    in the step of forming the pixel circuit, the pixel circuit being formed around the protruding section.

5. The method of manufacturing a wiring substrate according to claim 1,
    the providing of the at least one protruding section comprising providing a plurality of protruding sections formed within the pixel area.

6. The method of manufacturing a wiring substrate according to claim 1,
    the thickness of the peripheral circuit being equal to the thickness of the at least one protruding section.

7. The method of manufacturing a wiring substrate according to claim 1,
    a separation layer being formed between the peripheral circuit and the second substrate, and further comprising:
    supplying the separation layer with energy to weaken the adhesion force between the peripheral circuit and the second substrate after the step of bonding and prior to the step of separating.

8. The method of manufacturing a wiring substrate according to claim 1,
    in the step of bonding, the first and second substrates being bonded with a conductive adhesive intervening between the first substrate and the peripheral circuit.

9. The method of manufacturing a wiring substrate according to claim 1,
    a flexible substrate being used as the first substrate.

* * * * *